United States Patent [19]

Van Gastel et al.

[11] Patent Number: 5,722,527

[45] Date of Patent: Mar. 3, 1998

[54] METHOD OF POSITIONING A PRINTED CIRCUIT BOARD IN A COMPONENT PLACEMENT MACHINE AND COMPONENT PLACE MACHINE THEREFORE

[75] Inventors: Josephus M. M. Van Gastel; Jaap Oudes, both of Eindhoven, Netherlands

[73] Assignee: U.S. Philips Corporation, NY, N.Y.

[21] Appl. No.: 623,385

[22] Filed: Mar. 27, 1996

[30] Foreign Application Priority Data

Mar. 28, 1995 [EP] European Pat. Off. .............. 95200775

[51] Int. Cl.⁶ .................................................. B65G 47/22
[52] U.S. Cl. ............................. 198/345.3; 198/345.1
[58] Field of Search ............................. 198/345.1, 345.3; 29/729, 739, 740

[56] References Cited

U.S. PATENT DOCUMENTS

| | | | |
|---|---|---|---|
| 4,360,097 | 11/1982 | Brems | 198/345.3 |
| 4,898,268 | 2/1990 | Kamioka et al. | 198/345.1 |
| 4,947,980 | 8/1990 | Helmstetter | 198/345.3 |
| 4,951,240 | 8/1990 | Fukino | 364/489 |
| 5,086,556 | 2/1992 | Toi | 29/740 |
| 5,282,524 | 2/1994 | Kakida et al. | 198/345.3 X |

Primary Examiner—James R. Bidwell
Attorney, Agent, or Firm—Anne E. Barschall; Arthur G. Schaier

[57] ABSTRACT

A method of positioning a printed circuit board in a component placement machine and holding it in a plane condition. The exertion of a couple on two mutually opposed edge portions of a printed circuit board presses the printed circuit board flat onto a support.

5 Claims, 7 Drawing Sheets

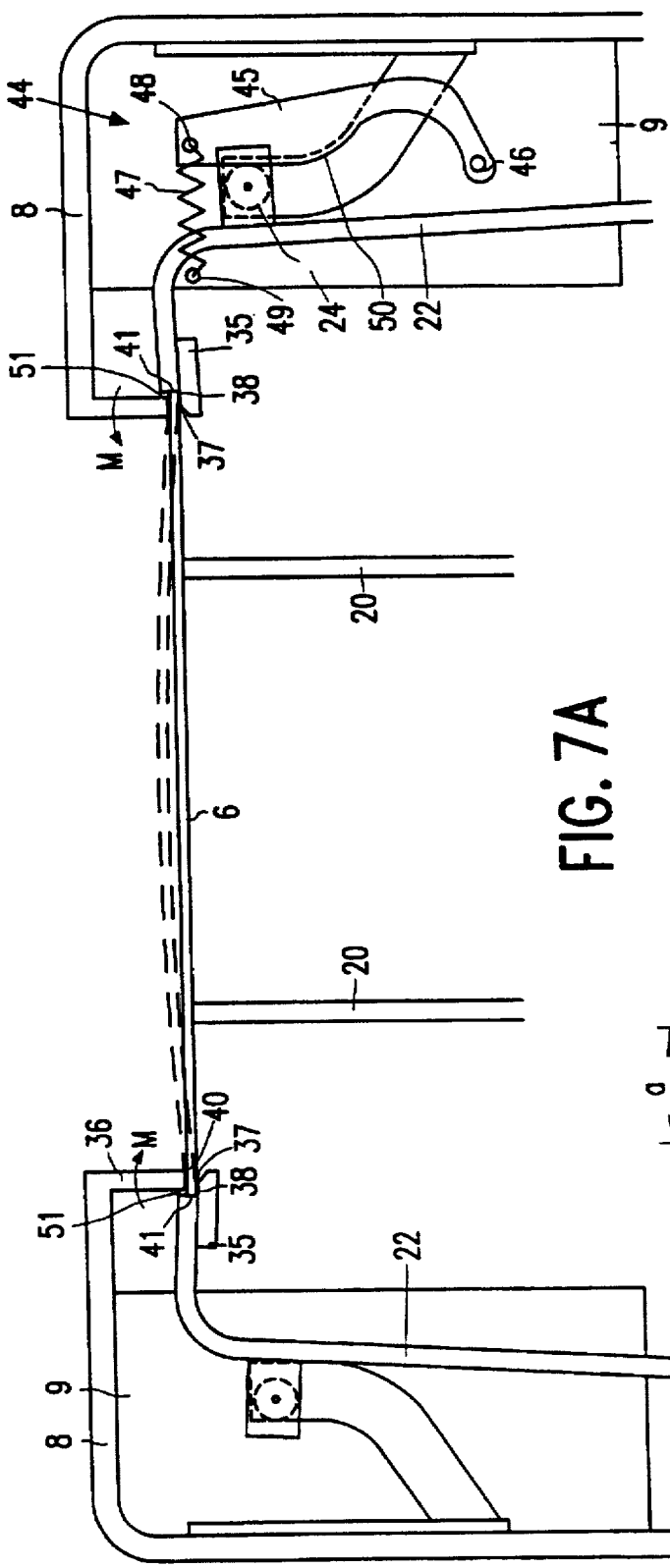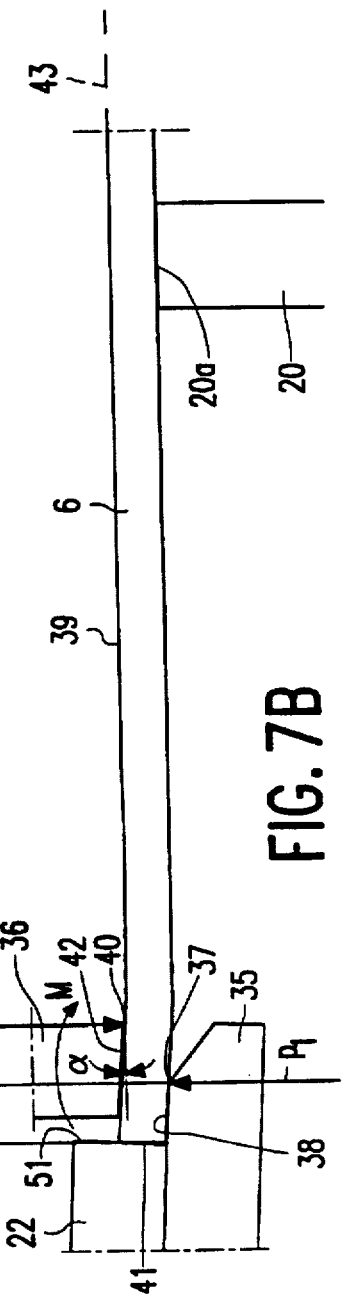
FIG. 7A
FIG. 7B

METHOD OF POSITIONING A PRINTED CIRCUIT BOARD IN A COMPONENT PLACEMENT MACHINE AND COMPONENT PLACE MACHINE THEREFORE

BACKGROUND OF THE INVENTION

1. Field of the Invention

The invention relates to a method of positioning a printed circuit board in a component placement machine, in which method positioning means bring the printed circuit board into a component placement position in which two mutually opposed edge potions of the printed circuit board are clamped and the printed circuit board bears on a support situated between the edge portions.

2. Description of the Related Art

It is important in component placement machines for the components to be placed on a printed circuit board with great accuracy. However, problems in the accurate placement of components may arise when the printed circuit board is not perfectly plane especially printed circuit boards whose upper surfaces, usually the component placement surfaces, are of convex shape. To solve this problem, U.S. Pat. No. 4,951,240 describes fixing two mutually opposed edge portions of the printed circuit board by clamping. The printed circuit board is brought into its component placement position by a transport belt, after which the printed circuit board, which remains on the transport belt, is clamped between a stationary and a movable clamping frame so that the printed circuit board and the transport belt are both between the clamping frames. Fixation by clamping of the edge portions alone of a printed circuit board aids in making a curved printed circuit board more or less plane, but it is not sufficient, certainly not in the central portion of a printed circuit board having a convex upper surface.

U.S. Pat. No. 5,086,556 describes pulling the printed circuit board against a plane support by means of vacuum. However, seating problems often arise using this method. The lower side of a printed circuit board is often also provided with electrical conductor tracks and components, or through holes. The use of vacuum is difficult then, if not absolutely impossible. The use of such a method is accordingly limited.

SUMMARY OF THE INVENTION

It is an object of the invention to provide a method of positioning printed circuit boards in a component placement machine in a plane condition and to keep them in this plane condition.

The method in accordance with the invention includes exerting a couple on the printed circuit board directed towards a side of the printed circuit board facing away from the support so that the printed circuit board is brought into a plane condition and is held therein.

The invention is based on the recognition that a printed circuit board can be positioned plane on a support through exerting a couple on two mutually opposed edge portions of the printed circuit board. Through the application of a couple directed towards the side of the printed circuit board facing away from the support, the printed circuit board is pressed onto the support and thus held plane. Printed circuit boards with a curvature, in whatever direction, are thus positioned in a plane condition so that the placement of components can proceed with greater accuracy.

In a preferred embodiment the printed circuit board is first brought to a stationary clamping frame of the clamping device by the support, the side of the printed circuit board facing away from the support being moved against the stationary clamping frame at a distance $a$ from the edge of the printed circuit board, after which the movable clamping frame is pressed against the side of the printed circuit board facing away from the stationary clamping frame at a distance $b$ from the edge of the printed circuit board, the distance $a$ being greater than the distance $b$, whereupon the movable clamping frame exerts a force on the printed circuit board in a direction substantially perpendicular to the printed circuit board.

The invention also relates to a component placement machine in which the above method is used. A component placement machine provided with a transport mechanism for transporting printed circuit boards in the machine, with a support for supporting the printed circuit board in a component placement position, and with a clamping device for fixing two mutually opposed edge potions of the printed circuit board by clamping, is characterized in that

- the clamping means comprise two sets of clamping frames situated on either side of the printed circuit board to be positioned, each set comprising a stationary and a movable clamping frame, whereby a couple can be exerted on an edge portion of the printed circuit board,

- driving means are present for displacing the support and for displacing the movable clamping frames, and

- pneumatic means are present for exerting a force on the movable clamping frames for obtaining a couple on the two mutually opposed edge portions of the printed circuit board.

Preferably, pressure rims of the stationary clamping frames which bear on the printed circuit board lie in a reference plane which coincides with a component placement surface of the printed circuit board. The component placement surface is usually the upper surface of a printed circuit board. The movable clamping frames are moved against the surface at the lower side of the printed circuit board. The upper side of the printed circuit board accordingly always lies in a fixed reference plane of the machine, irrespective of the thickness of the printed circuit board. A quick and accurate placement of components is rendered possible thereby.

In an alternative embodiment the stationary clamping frames are provided with pressure surfaces against which the printed circuit boards will lie and which enclose an angle $\alpha$ of between 0.5° and 5° with the reference plane, and the pressure rims of the movable clamping frames lie opposite the pressure surfaces of the stationary clamping frames cooperating therewith. This results in a limitation of the couple so that the risk of breaking of the printed circuit board is considerably reduced.

BRIEF DESCRIPTION OF THE DRAWINGS

For a fuller understanding of the invention, reference is had to the following description taken in connection with the following drawings, in which:

FIG. 7b shows in detail how the printed circuit board is clamped in.

DESCRIPTION OF THE PREFERRED EMBODIMENT

Figure 1:
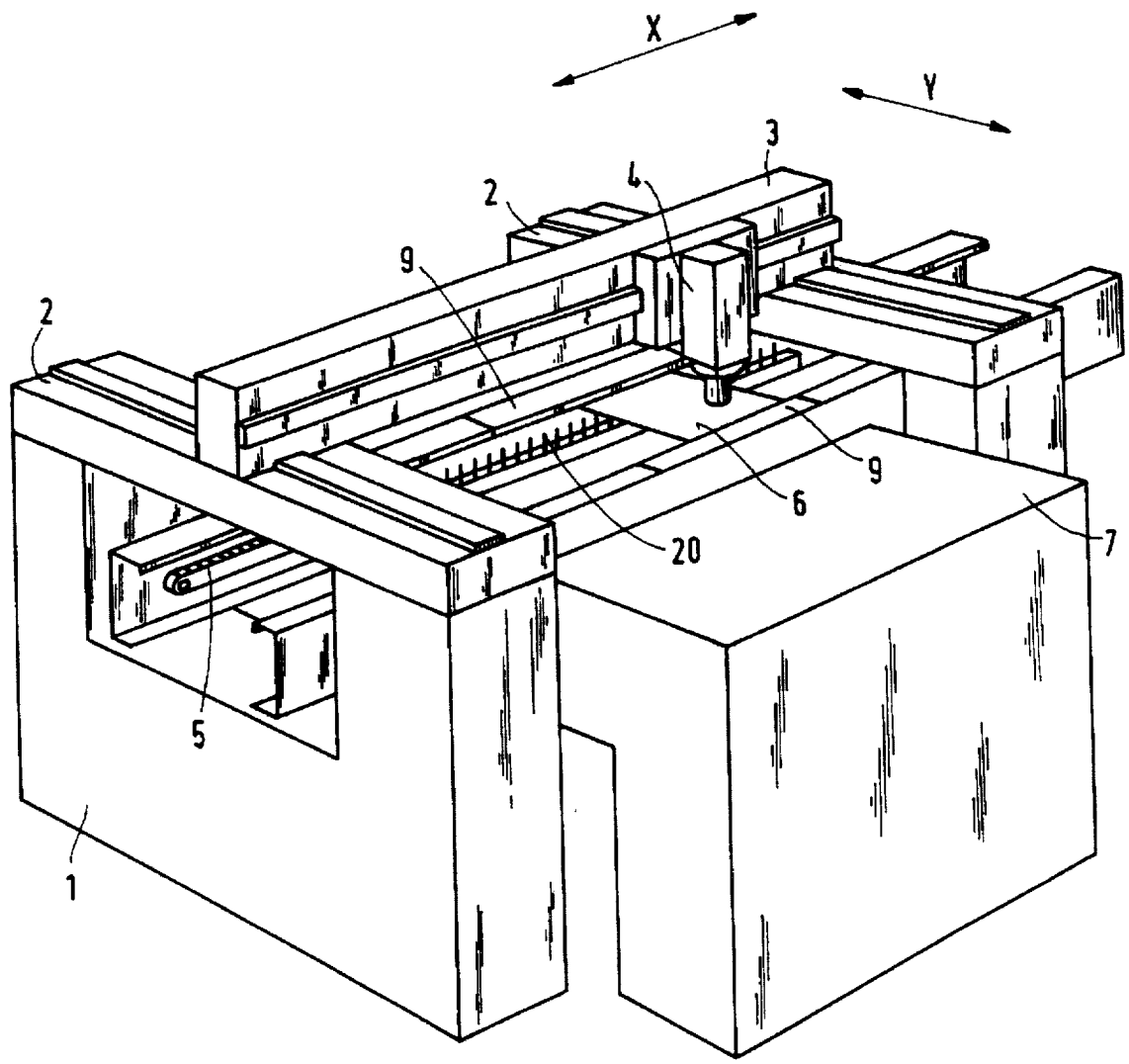
FIG. 1 is a perspective view of a component placement machine constructed in accordance with the present invention, FIGS. 2–6 diagrammatically show the steps in which a printed circuit board is positioned in the component placement machine of FIG. 1, FIG. 7a diagrammatically and on an enlarged scale shows the clamping-in of the printed circuit board in its component placement position.

The component placement machine of FIG. 1 comprises a machine frame 1 with two parallel guide beams 2. A slide 3 mounted on the guide beams is displaceable over the beams in the y-direction. A component placement head 4 is fastened on the slide 3 and displaceable over the slide in the x-direction. The machine has a transport mechanism for transporting printed circuit boards 6 through the machine. The transport belt 5 only of this transport mechanism is shown. The component placement head 4 takes up components from a component feeder 7 and places them on the printed circuit board.

FIGS. 2 to 6 show a number of steps in the process of positioning a printed circuit board in a component placement machine. For simplicity's sake, the construction for positioning is shown on the left-hand side of the printed circuit board only. A similar construction is present on the right-hand side. The following components are shown in the construction of FIGS. 2 to 6 (see FIG. 2):

a U-shaped frame 8 which acts as a carrier for the various components and which itself is fastened to the machine frame 1 of the placement machine; a frame plate 9 which is rigidly fastened to the frame 8; a transport belt support 10 fastened to the frame plate; transport belt 5 which runs over transport ledges 11 and which is driven by driving means (not shown) for the transport of printed circuit boards 6 in a direction perpendicular to the plane of drawing (in FIG. 1, the x-direction); a threaded spindle 12 which has its bearings between two bearing blocks 13 fastened to the frame; a motor 14 also fastened to the frame and capable of bringing the threaded spindle into rotation via a gear train 15; a support 16 provided with a guide stud 17 which can move up and down along a guide 18 fastened to the frame; a nut 19 fastened to the support 16 and provided on the threaded spindle 12, so that rotation of the threaded spindle will move the support up and down; support pins 20 fastened on the support 16 for supporting the printed circuit board 6, only one such pin being shown in the Figure; a peg 21 also fastened to the support 16; a movable beam 22 provided with a support 23 with a guide wheel 24, which guide wheel can be guided in a guide track 25 fastened to the frame plate 9; a pneumatic device, generally indicated at 26 comprising a number of units situated in the longitudinal direction of the beam 22 and each formed by a cylinder 27, a piston 28, a piston rod 29, and a spring 30, the piston 28 being fastened to one end of the piston rod 29 whose other end is rotatably connected to the beam 22; the cylinder 27 is further rotatable about a bearing 31 in the frame; the space 32 in the cylinder 27 below the piston 28 is connected to an HP-air source 33; the air pressure can be set with a control valve 34; two sets of clamping frames 35, 36, each set being formed by a clamping frame 35 fastened to the movable beam 22 and accordingly referred to as the movable clamping frame 35 hereinafter, and another clamping frame 36 fastened to the frame 8 and accordingly referred to as the stationary clamping frame 36 hereinafter; the two sets of clamping frames 35, 36 serving for fixing two mutually opposed edges of the printed circuit board 6 by clamping as will be described further below.

Figure 2:
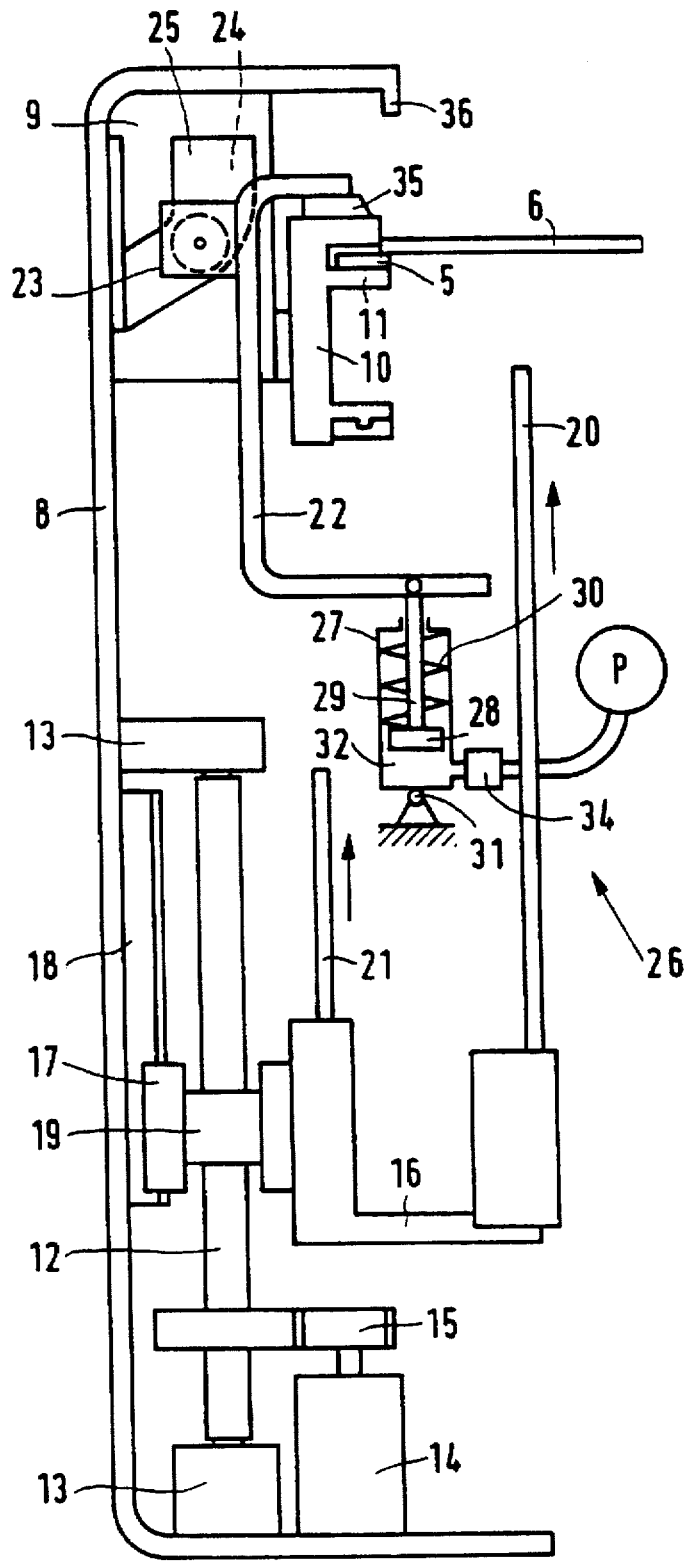
Figure 3:
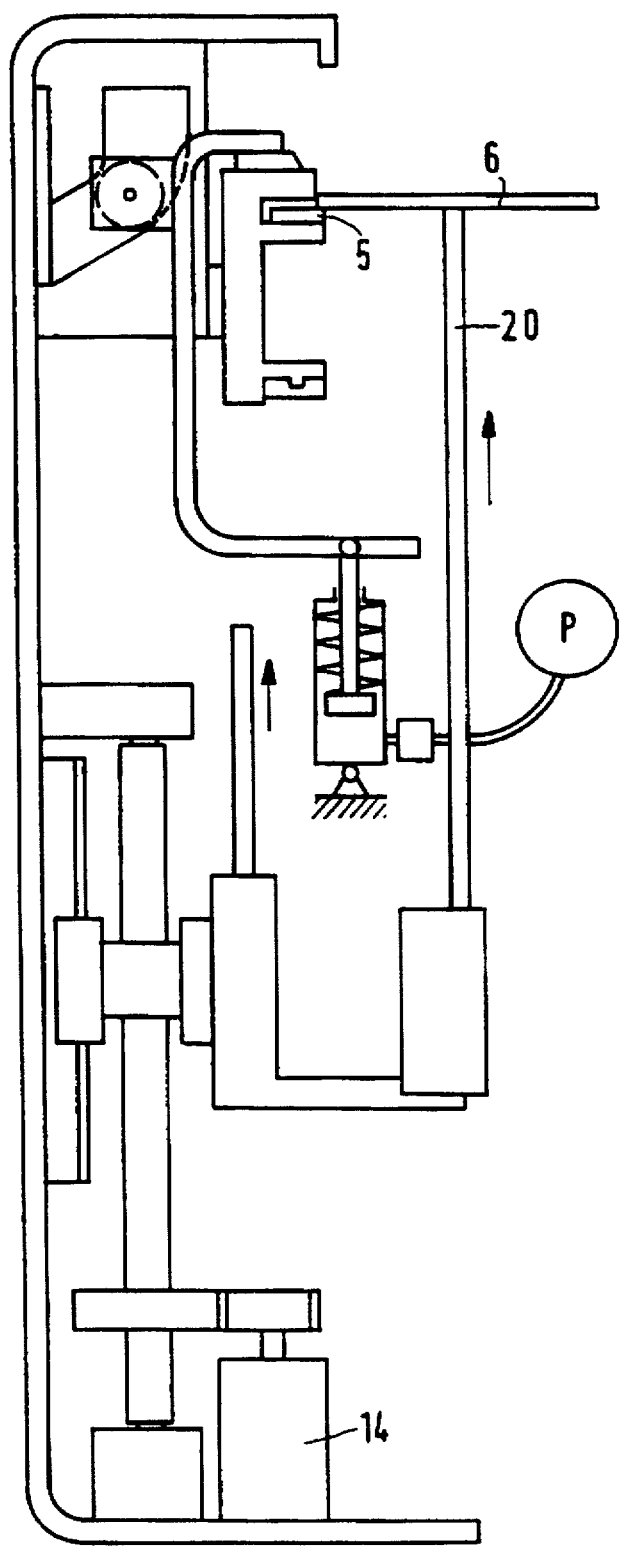
Figure 4:
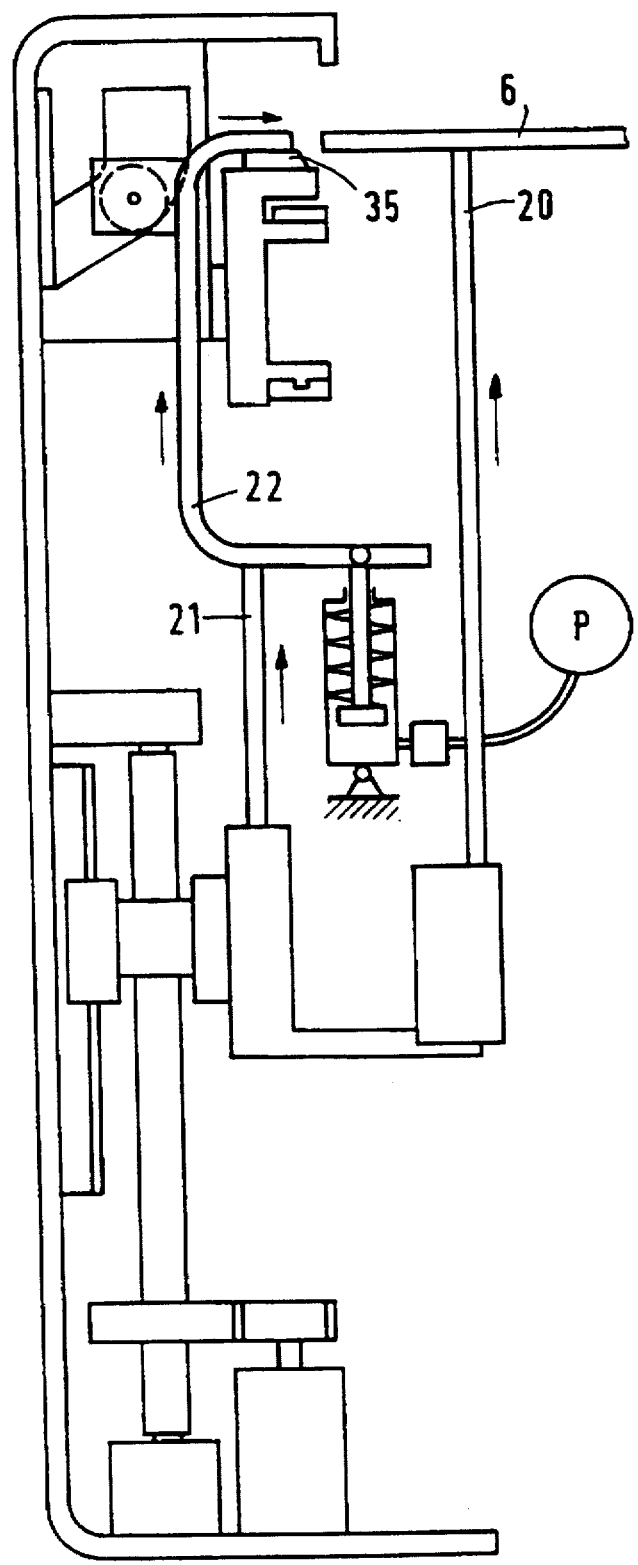
Figure 5:
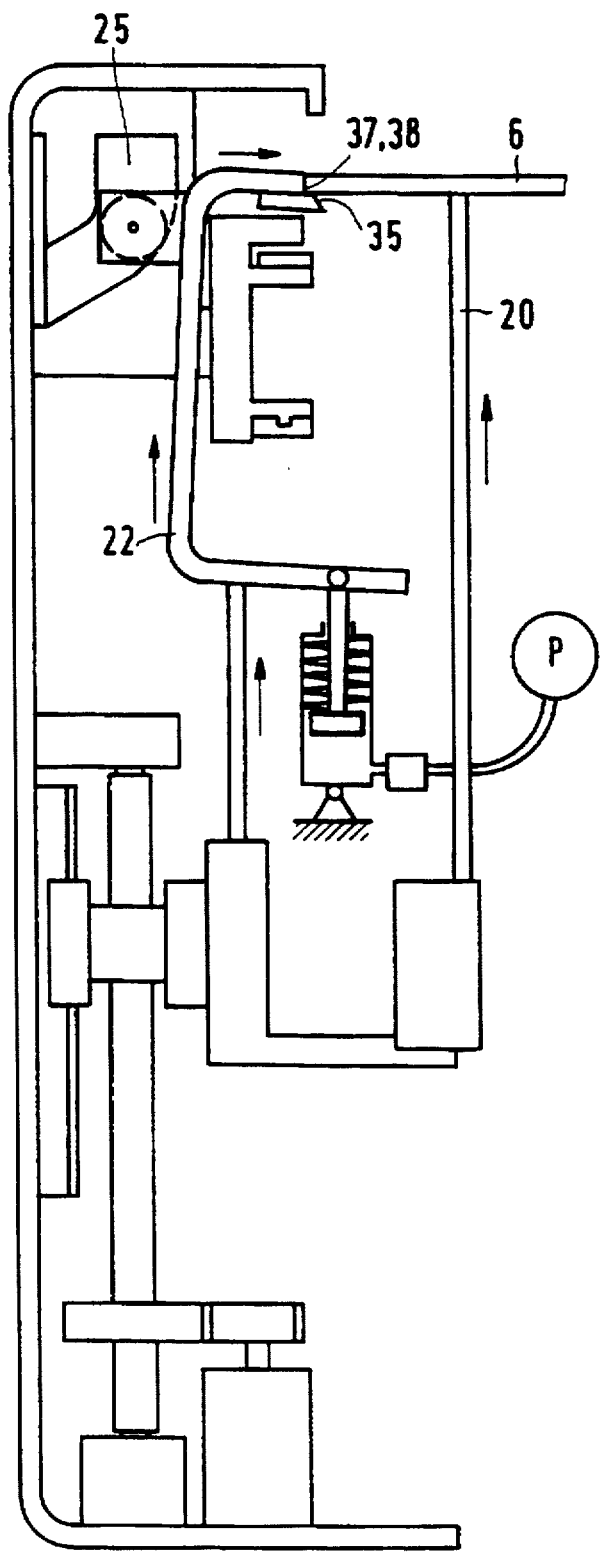
Figure 6:
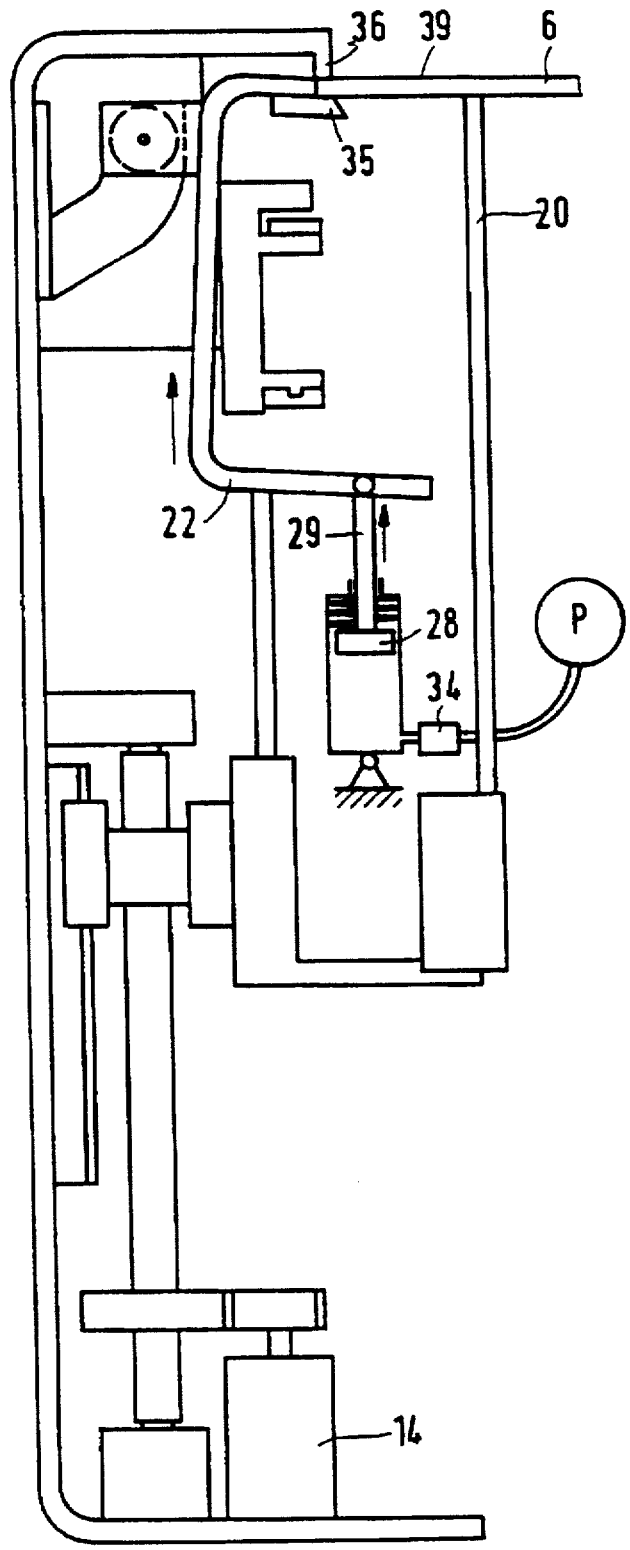

As was noted above, a similar positioning construction is present on the left and on the right of the printed circuit board, corresponding components moving simultaneously during positioning of a printed circuit board. The printed circuit board 6 is brought into a position in which components are to be placed on the printed circuit board by means of transport belt 5 (FIG. 2). Then the motor 14 is switched on, so that the support 16 moves up and the support pins 20 move towards the printed circuit board 6 (FIG. 3) and subsequently lift the printed circuit board from the transport belt. The movements of the various parts are indicated with arrows. When the printed circuit board 6 has roughly reached the level of the movable clamping frame 35, the peg 21 which moves up simultaneously with the support pins 20 makes contact with the beam 22 and presses the latter up. The movable clamping frame 35 as a result also moves up (FIG. 4). Owing to the shape of the guide track 25, the beam 22 undergoes a slight tilting movement whereby the movable clamping frame 35 is also moved towards the printed circuit board 6, transversely to the upward movement, so that a pressure rim 37 of the movable clamping frame 35 slides below an edge portion 38 of the printed circuit board 6 (FIG. 5). Subsequently, the printed circuit board is moved up until it hits with its upper side 39 against the stationary clamping frame 36. The motor 14 stops and opening of the control valve 34 causes the piston 28 to come under air pressure. As a result, the piston 28 exerts an upward force on the beam 22 via the piston rod 29 (FIG. 6).

The situation thus obtained is displayed in FIG. 7a on an enlarged scale for the two mutually opposed sides of the printed circuit board. An initially curved printed circuit board is indicated with a broken line. As is clearly shown in this Figure, two mutually opposed edge portions 38 of the printed circuit board rest on respective pressure rims 37 of the clamping frames 35, the pressure rim 37 of the clamping frame being situated at a distance b from the edge of the printed circuit board (see FIG. 7b). Farther to the inside, the printed circuit board is supported by the support pins 20. The upper surfaces 20a of the support pins 20 and the pressure rims 37 of the clamping frames 35 lie in one plane. The stationary clamping frames 36 are provided with pressure rims 40 which are situated at a distance a from the edges 41 of the printed circuit board 6. The distance a is greater than the distance b. The movable clamping frames 35 are now pressed up by the pneumatic device 26, so that the pressure rims 37 of the clamping frames exert upward forces P1 on the edge portions 38 of the printed circuit board. As a result, opposed reaction forces P2 arise on the printed circuit board at the areas of the pressure rims 40 of the stationary clamping frames 36. The resulting couple M which is directed towards the upper side 39 of the printed circuit board presses the latter flat onto the support pins.

The couple must be limited in order to prevent fracture of the printed circuit board. An efficient method of limiting the couple may be obtained by two measures. The first step is to bevel off a lower surface 42 of the stationary clamping frame 36 somewhat, for example, through an angle α of 1° or 2° in an upward direction, seen from the center of the printed circuit board to the edges thereof. The second step is to position the pressure rim 37 of the movable clamping frame 35 opposite the beveled lower surface 42 of the stationary clamping frame. In fact, the point of the movable clamping frame 35 where the force P1 is transmitted to the printed circuit board must lie opposite the lower surface 42 of the stationary clamping frame 36. When the force P1 is increased, the couple M increases until the edge of the printed circuit board bears entirely on the lower surface 42 of the stationary clamping flame 36, so that this lower surface will act as a pressure surface. The reaction force P2 then no longer is applied to the area of the pressure rim 40 of the stationary clamping frame, but is distributed over the lower surface 42. When the force P1 increases, the couple M does not increase any more. In practice, the force P1 will be chosen to be greater so as to be sure that the printed circuit board 6 will lie on the support pins 20. Alternative devices may be used for moving the movable clamping frame 35 up instead of the penumatic devices. An example is a mechanism driven by a servomotor.

The plane defined by the pressure rims 40 of the stationary clamping frames is the reference plane 43 of the printed circuit boards. This reference plane coincides with the upper surface 39 of the printed circuit board, i.e. the surface on which the components are placed. This means that the upper side 39 of the printed circuit board will always lie in the same location in the machine, irrespective of the thickness of the printed circuit board.

A pressure mechanism generally indicated at 44 is further shown in the right-hand part of FIG. 7a whereby any lateral play of the printed circuit board relative to the movable clamping frames, i.e. in the plane of the printed circuit board, can be neutralized. The pressure mechanism 44 comprises an arm 45 which is journaled around a pivot point 46 in the frame plate 9, and a spring 47 which is tensioned between the free end 48 of the arm 45 and a fastening point 49 of the frame plate 9. An edge portion 50 of the arm 45 presses against the guide wheel 24, so that the right-hand movable beam 22 shown in the drawing is forced to the left. The beam 22 presses the printed circuit board 6 also to the left, so that the two mutually opposed edges 41 of the printed circuit board 6 are enclosed between the raised rims 51 of the movable beams 22.

After the placement of the components, all parts mentioned move in reverse order again, so that the printed circuit board will lie on the transport belt again for further transport to a next position in the next position in the placement machine or to a next processing station.

We claim:

1. A method of positioning a printed circuit board in a component placement machine, in which method positioning means bring the printed circuit board into a component placement position in which two mutually opposed edge portions of the printed circuit board are clamped by clamping means and the printed circuit board bears on a support situated between the edge portions, characterized in that the clamping means exert a couple on the printed circuit board which is directed towards a side of the printed circuit board facing away from the support such that the printed circuit board is brought into a plane condition and is held therein.

2. The method as claimed in claim 1, characterized in that the printed circuit board is first brought to a stationary clamping frame of the clamping means by the support, the side of the printed circuit board facing away from the support being moved against the stationary clamping frame at a distance a from the edge of the printed circuit board, after which the movable clamping frame is pressed against the side of the printed circuit board facing away from the stationary clamping frame at a distance b̲ from the edge of the printed circuit board, the distance a being greater than the distance b̲, whereupon the movable clamping frame exerts a force on the printed circuit board in a direction substantially perpendicular to the printed circuit board.

3. A component placement machine provided with transport means for transporting printed circuit boards in the machine, with a support for supporting the printed circuit board in a component placement position, and with clamping means for fixing two mutually opposed edge portions of the printed circuit board by clamping, characterized in that the clamping means comprise two sets of clamping frames situated on either side of the printed circuit board to be positioned, each set comprising a stationary and a movable clamping frame, whereby a couple can be exerted on an edge portion of the printed circuit board, driving means are present for displacing the support and for displacing the movable clamping frames, and pneumatic means are present for exerting a force on the movable clamping frames for obtaining a couple on the two mutually opposed edge portions of the printed circuit board.

4. The component placement machine as claimed in claim 3, characterized in that pressure rims of the stationary clamping frames which bear on the printed circuit board lie in a reference plane which coincides with a component placement surface of the printed circuit board.

5. The component placement machine as claimed in claim 3, characterized in that the stationary clamping frames are provided with pressure surfaces against which the printed circuit boards will lie and which enclose an angle $\alpha$ of between 0.5° and 5° with the reference plane, and in that the pressure rims of the movable clamping frames lie opposite said pressure surfaces.

* * * * *